(12) United States Patent
Cuppens et al.

(10) Patent No.: US 7,663,917 B2
(45) Date of Patent: Feb. 16, 2010

(54) NON-VOLATILE STATIC MEMORY CELL

(75) Inventors: Roger Cuppens, Eindhoven (NL); Anthonie Meindert Herman Ditewig, Eindhoven (NL)

(73) Assignee: NXP B.V., Eindhoven (NL)

( * ) Notice: Subject to any disclaimer, the term of this patent is extended or adjusted under 35 U.S.C. 154(b) by 270 days.

(21) Appl. No.: 10/560,677

(22) PCT Filed: Jun. 10, 2004

(86) PCT No.: PCT/IB2004/050882

§ 371 (c)(1),
(2), (4) Date: Dec. 14, 2005

(87) PCT Pub. No.: WO2004/112047

PCT Pub. Date: Dec. 23, 2004

(65) Prior Publication Data

US 2006/0158925 A1    Jul. 20, 2006

(30) Foreign Application Priority Data

Jun. 17, 2003  (EP) .................................. 03101770

(51) Int. Cl.
    *G11C 14/00*    (2006.01)
(52) U.S. Cl. .............. 365/185.08; 365/154; 365/185.07
(58) Field of Classification Search .................. 365/154, 365/185.08, 185.03, 185.05, 189.05, 189.07
    See application file for complete search history.

(56) References Cited

U.S. PATENT DOCUMENTS

| 4,527,255 A * | 7/1985 | Keshtbod .................... 365/154 |
| 4,541,073 A | 9/1985 | Brice et al. |
| 4,635,229 A | 1/1987 | Okumura et al. |
| 5,602,776 A | 2/1997 | Herdt et al. |
| 5,646,885 A | 7/1997 | Matsuo et al. |
| 5,696,455 A | 12/1997 | Madurawe |
| 5,805,496 A | 9/1998 | Batson et al. |

(Continued)

FOREIGN PATENT DOCUMENTS

JP    58-94227 A    6/1983

(Continued)

OTHER PUBLICATIONS

Chrzanowska-Jeske, "Architecture and Technology of FPGAs-an Overview", Northcon/93, Oct. 12-14, 1993, pp. 82-86.

(Continued)

*Primary Examiner*—Vu A Le
*Assistant Examiner*—Han Yang

(57) ABSTRACT

A static memory cell comprising a pair of cross-coupled inverters (10, 12) which is "shadowed" with non-volatile memory elements (14, 16) so that data written in the static memory can be stored in the non-volatile cell, but also can be recalled later. The non-volatile cells (14, 16) are programmed with opposite data to increase the robustness of the retrieval process, and they are cross-coupled to the internal nodes (A, B) of the static memory cell, one the non-volatile cells (14) having a control gate connected to B and its source to A, and the other non-volatile element (16) having a control gate connected to A and its source to B. The drain of each non-volatile element (14, 16) is connected by means of a respective pMOS transistor (18, 20) to a program supply means.

10 Claims, 3 Drawing Sheets

U.S. PATENT DOCUMENTS

| | | |
|---|---|---|
| 5,914,895 A | 6/1999 | Jenne |
| 6,304,482 B1 * | 10/2001 | Lin et al. .................... 365/154 |
| 6,363,011 B1 * | 3/2002 | Hirose et al. ........... 365/185.07 |
| 6,414,873 B1 * | 7/2002 | Herdt .................... 365/185.08 |
| 6,515,907 B2 * | 2/2003 | Miyagi .................. 365/185.21 |
| 7,164,608 B2 * | 1/2007 | Lee ....................... 365/189.05 |

FOREIGN PATENT DOCUMENTS

| | | |
|---|---|---|
| JP | 60-151898 A | 8/1985 |
| JP | 62-33393 A | 2/1987 |
| JP | 7-226088 A | 8/1995 |
| JP | 8-509091 A | 2/1996 |
| JP | 3-97197 A | 4/1997 |
| WO | 95/22144 A1 | 8/1995 |

OTHER PUBLICATIONS

Notification of Reason for Rejection in JP 2006-516674 (Apr. 28, 2009).

Office Action in CN 200480016966.9.

Office Action in EP 04736564.8 (Dec. 12, 2006).

* cited by examiner

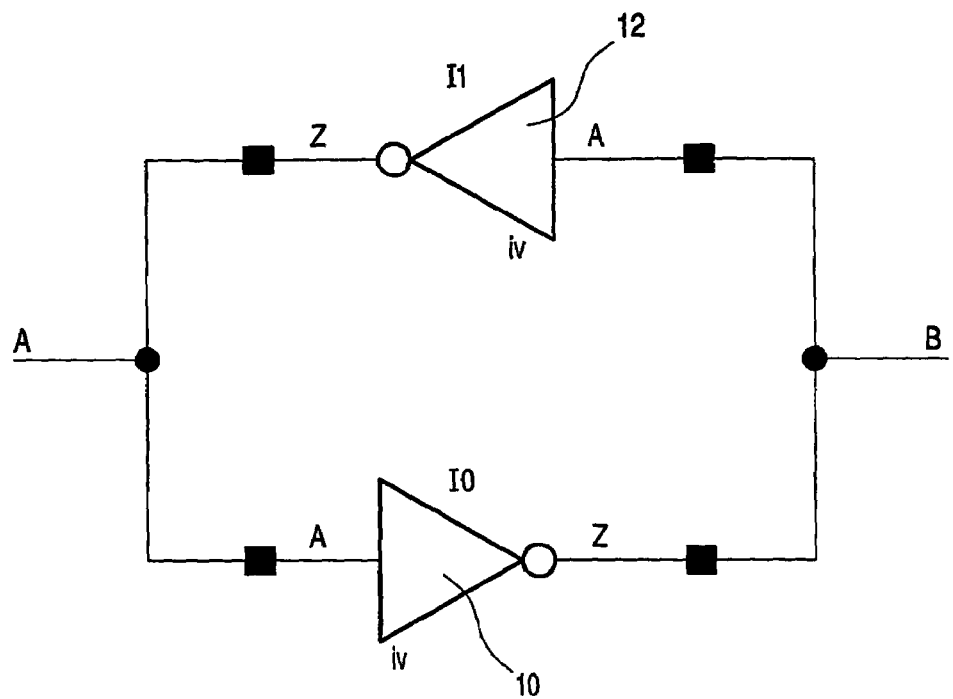
FIG. 1
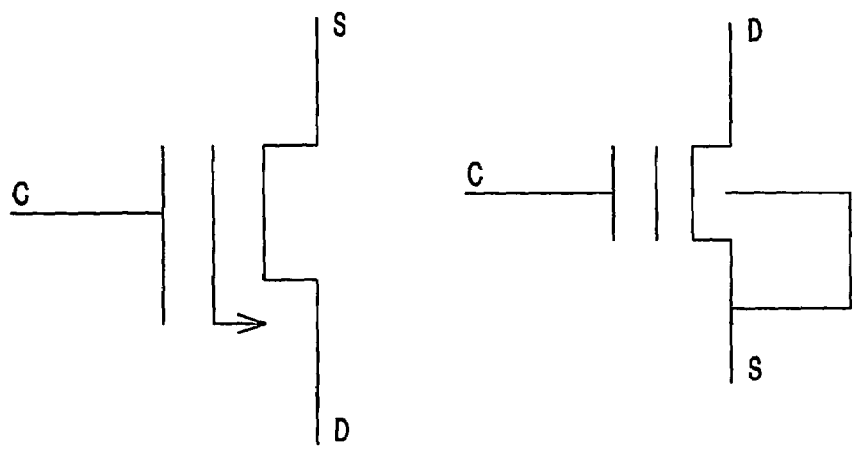
EEPROM
FIG. 2A
flash
FIG. 2B

NON-VOLATILE STATIC MEMORY CELL

This invention relates to a non-volatile static memory cell for use in, for example, systems on chip (SoC) designs including reconfigurable systems which need to be reconfigured at power-up.

A programmable logic device, such as a field programmable gate array (FPGA), is a programmable integrated circuit that allows the user of the circuit, using software control, to customize the logic functions the circuit will perform. The logic functions previously performed by small, medium and large scale integration integrated circuits can instead be performed by programmable logic devices. When a typical programmable logic device is supplied by an integrated circuit manufacturer, it is not yet capable of performing any specific function. The user, in conjunction with software supplied by the programmable logic device manufacturer, can program the programmable logic device to perform the specific function or functions required by the user's application. The programmable logic device can then function in a larger system designed by the user, just as though dedicated logic chips were employed.

A typical programmable logic device consists of an array of logic cells that can be individually programmed and arbitrarily interconnected to each other to provide internal input and output signals, thus permitting the performance of highly complex combinational logic and sequential logic functions. The program is implemented in the programmable logic device by setting the states of the programmable elements such as the memory cells. These memory cells may be implemented with volatile memories, such as static random access memories (SRAMs), which lose their programmed states upon termination of power to the system, or with non-volatile memories, such as EPROMs or EEPROMs, which retain their contents upon termination of power.

It is generally preferred to use volatile memories for this purpose. However, if the programmable elements used are volatile memories, the memory cells must be reconfigured upon system power-up in order to restore the programmable logic device to the desired programmed state. The reconfiguration step is achieved, in known arrangements, by saving the configured states in an external non-volatile memory device which will save the programmable logic device configuration even after power-down. Then, when power is restored to the system, the configured states of the memory cells are serially loaded from the non-volatile external memory device to the programmable logic device, which is time-consuming.

In addition, this method of reconfiguration of a programmable logic device forces the system designer to include additional control logic dedicated to serial loading of configuration data from the external memory device every time the system is powered up. Furthermore, each time the configuration of the programmable logic device is altered, a new external non-volatile memory device must be inserted into the system, making system design changes cumbersome and increasing the expense of the system as more and more design changes are implemented.

Thus, in summary, Systems-on-Chip (SoC) designs tend to be based on reconfigurable architectures with distributed memory blocks. This can be realized with embedded field programmable gate array (FPGA)-like structures. The heart of this can be an SRAM-like cell which is well-suited to storage of data for the redirection of switches. After restoring the power to such systems, following power-down, the initial data has to be restored from an external non-volatile medium (e.g. flash memory) or from an on-board non-volatile (programmable) memory (e.g. flash memory or ROM). In the latter case, the SoC can only be made in a process with a flash memory option. The time needed to restore the data will contribute a significant part of the start-up time of the system. Typically, byte-wise reading the non-volatile data and storing it in an SRAM cell can take about 100 nsec per byte.

U.S. Pat. No. 5,696,455 describes a reconfigurable programmable logic device in a single integrated circuit package that saves its own programmed state without the use of an external memory device. A non-volatile memory element and a volatile memory element (such as an SRAM cell) collectively form a configuration memory cell on a single die in the programmable logic device. Each non-volatile memory cell is associated with one volatile memory cell and stores the programmed state of the associated volatile memory cell even after termination of power to the system. Each non-volatile memory cell then automatically restores the configured state of its associated volatile memory cell upon system power-up, thereby eliminating the need for an external memory device for storing the configured programmable logic device states.

We have now devised an improved arrangement.

In accordance with the present invention, there is provided a memory device comprising, in a single integrated circuit package:

a static memory means defining at least first and second nodes communicatively connected with read and/or write data lines; and at least one non-volatile memory means associated with said static memory means, and writing data stored therein to said static memory means;

characterized in that said non-volatile memory means comprises at least two non-volatile memory elements cross-coupled to said first and second nodes respectively.

The addition of such non-volatility to a static memory means in this way can limit the data restore time to a short cycle of, say, less than 100 nsecs. Further, it increases the flexibility of the device, since intermediate states can be stored in the non-volatile memory and recovered anytime, independently of what was written in the static memory means. Furthermore, the data for the redirection of switches can be proven first (in the application) and stored afterwards in the non-volatile memory means. In other applications, the memory device of the present invention could be used to replace conventional SRAM memories with small battery back-up means.

The claimed device fits in a logic process with, for example, an embedded flash or EEPROM option, which can be programmed and erased by Fowler Nordheim tunneling. The device of the present invention can be realized with little or no modification of this process. Floating gate cells in a double poly flash or EEPROM process option may be used for non-volatile storage of data, or a single poly floating gate type of memory cell may also be used. Further, other non-volatile memory cell concepts (such as SONOS devices), which can be programmed and erased via tunneling of charges, can be adapted for this application.

In a preferred embodiment, the cross-coupled non-volatile memory elements are programmed with opposite data, and the static memory means preferably comprises a pair of cross-coupled inverters. Beneficially, a first non-volatile element has a control gate connected to a first node and a source connected to a second node, and a second non-volatile element has a control gate connected to the second node and a source connected to the first node. In a preferred embodiment, the drain of each non-volatile element is connected, preferably by means of a respective transistor, to a supply means.

One or more respective selection transistors may be provided, by means of which the nodes are communicatively coupled to the read and/or write lines. One or more isolation transistors may also be provided.

The invention extends to a reconfigurable programmable logic device, such as a field programmable gate array, including a memory device as defined above.

These and other aspects of the present invention will be apparent from, and elucidated with reference to, the embodiments described hereinafter.

Embodiments of the present invention will now be described by way of examples only and with reference to the accompanying drawings, in which:

FIG. 1 is a schematic diagram illustrating cross-coupled inverters configured as a static memory function;

FIGS. 2A and 2B are circuit symbols denoting EEPROM and flash memory elements respectively;

Figure 3:
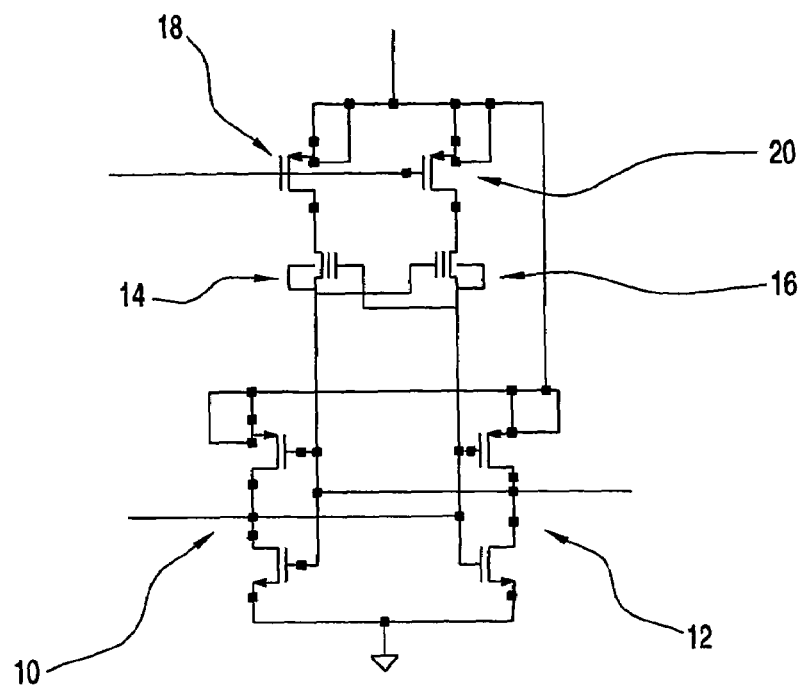
FIG. 3 is a schematic circuit diagram illustrating a non-volatile static memory cell according to a first exemplary embodiment of the present invention.

Referring to FIG. 1 of the drawings, commonly, the storage function of an SRAM memory cell or a look-up table (LUT) and configuration memory in an FPGA is realized with a pair of cross coupled inverters 10, 12. Depending on the application, the two internal nodes A and B are connected via one or more selection transistors to read and/or write data lines, that are mostly common to other devices.

For the configuration memory, the output of the cross-coupled inverters 10, 12 can also be directly coupled to the configuration switch. Data, once written in such a cell, stays available until new is supplied or as long as the power supply voltage is connected. After powering on a device, the data in the device is in an undefined state and needs to be re-loaded. As explained above, in accordance with the prior art, the data for a FPGA can be stored externally or in an embedded non-volatile memory (e.g. flash or EEPROM). This restoration of data takes time because the data has to be read and written word-by-word.

In accordance with an exemplary embodiment of the invention, adding non-volatile memory elements to this cross-coupled inverter arrangement has the effect of upgrading it to a non-volatile memory, maintaining the ability for a fast static write to each memory element, thereby allowing in one short cycle, the non-volatile storage of the present data, which can be recalled at a later stage, independently of the temporary data in the static memory.

Referring to FIG. 2 of the drawings, two different configurations are schematically illustrated of non-volatile storage elements based on storage of charges on a floating gate of a transistor. Both illustrated types are available as process options for a logic process. The storage and removal of charge on the floating gate occurs by means of Fowler Nordheim tunneling through a tunnel oxide. In case of EEPROM (FIG. 2A), this tunnel region is located in the drain region of the floating gate transistor, while for the flash (FIG. 2B), the gate oxide of the floating gate device is also the tunnel oxide. To allow tunneling over the whole gate oxide area, these devices are fabricated in a triple well process and the p well of each floating gate transistor is in this case connected to its source. This permits the modification of the data in the flash without an erase function, as would be the case in a classical flash or EEPROM cell.

Applying a high voltage (>10V) to the control gate (C) and keeping the drain (D) and source (S) at ground level causes a sufficient voltage to develop over the tunnel oxide between the floating gate and drain (for EEPROM) or channel (for flash) to allow electrons to tunnel towards the floating gate. This negative charge stored at the floating gate increases the threshold voltage of the memory transistor and, under normal bias conditions, makes the device less conductive (or even non-conducting). Inverting the high voltage will remove the electrons from the floating gate, leaving a positive charge on the floating gate, which decreases the threshold voltage of the device and makes the device much more conductive. It is also possible to end the program cycle with a negative threshold voltage, and in this case, the memory transistor can conduct a current even with a control gate to source voltage of 0V.

In accordance with an exemplary embodiment of the invention, the static memory cell of FIG. 1 can be "shadowed" with non-volatile memory elements so that the data written in the static cell can not only be stored in a non-volatile memory means, but can also be recalled later on.

FIG. 3 illustrates an exemplary implementation of the invention using flash cells 14, 16, as illustrated in FIG. 2B. In this case, two non-volatile cells 14, 16 programmed with opposite data, are used to increase the robustness of the retrieval process. The cross-coupled inverters 10, 12 are formed by the transistors, MN1, MP3 and MN0, MP2 respectively. The non-volatile elements 14, 16 are also cross-coupled to the nodes A and B. One of the non-volatile elements has its control gate C connected to node B and its source to node A, and the other non-volatile element has its control gate connected to node A and its source to node B. The drain of each non-volatile element is via a separate respective pMOST transistor 18, 20 connected to the program supply VDP which also supplies the static cell. These transistors 18, 20 are used for the recall operation and to isolate the drains of each cell to avoid conflicts during the program cycle.

In the normal mode, the memory device can be accessed and written to as a static memory. VDP is at supply voltage level (Vdd) and the recall bar (RCB) is also at Vdd, keeping the transistors 18 and 20 off. The node A can be at Vdd or ground level, but node B will always be at the opposite level.

Data can be transferred from the static cell to the non-volatile elements 14, 16 by increasing VDP voltage to a high level. The level of RCB must follow VDP. If, before storage, node A was at Vdd and node B was at ground level, then A will follow VDP and B will remain at ground, such the non-volatile cell with the control gate connected to A will have a high voltage at this gate and ground level at the source. This device will collect electrons on its floating gate and become less conductive. The other cell sees opposite voltages (i.e. ground at control gate and high voltage at the source) and will collect positive charges on the floating gate so as to become more conductive.

At any time, the data stored in a non-volatile cell can be recovered in the static cell. In order to achieve this, RCB must be forced to ground level, in which case, the most conducting cell will try to force a current in the node where the source is connected (node A in this case) and will lift the voltage level of that node. After switching RCB, the amplification in the static cell will bring that node to Vdd and will also discharge the other node. To get a robust recall operation, the size of the nMOS transistors MN0 and MN1 should be selected to be small enough so that even small currents from the non-volatile element(s) can switch the level in the static cell. Further, the transistors in the memory cell are subjected, during programming, to high voltages and therefore have to be designed to withstand this situation for a sufficiently long period of time.

The selection transistors (not shown in FIG. 3) can also be designed or selected to block propagation of high voltage while data is being stored. All other circuits around this memory element will see only normal supply voltages.

Figure 4:
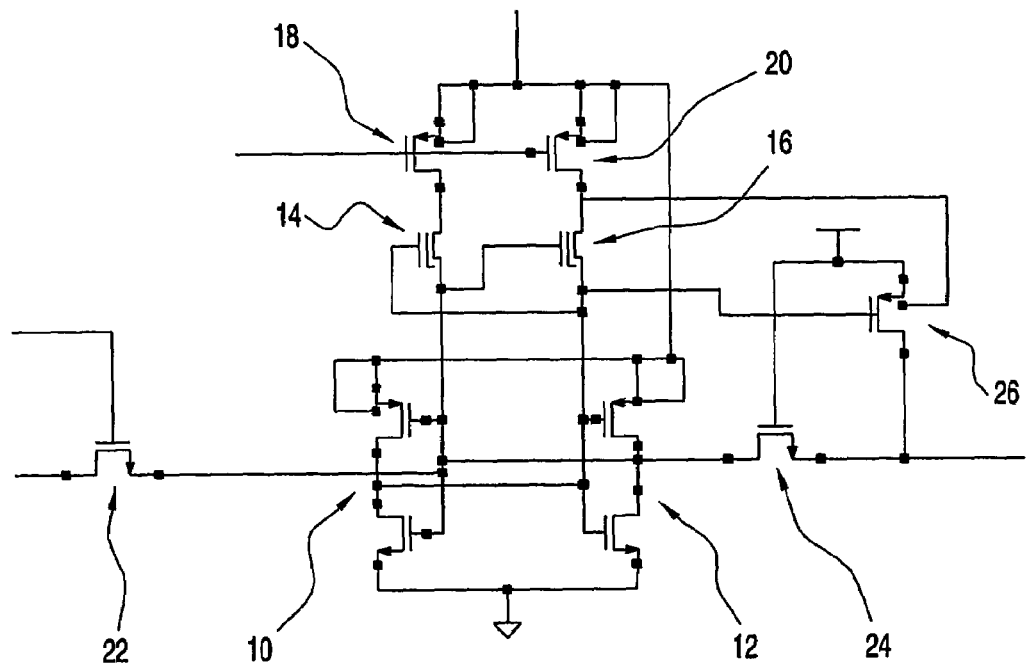
FIG. 4 is a schematic circuit diagram illustrating a non-volatile latch with an EEPROM element, according to a second exemplary embodiment of the present invention, and operating as a switch memory in a field programmable gate array.

FIG. 4 illustrates a non-volatile static memory element with EEPROM cells 14, 16 for the non-volatile storage. Here, both a selection transistor 22 and isolation transistor 24 with a voltage level restoring transistor 26 are illustrated. This cell can be used, for example, for storage of switch selection information in FPGA's. The data in the cell can be modified via the DAT line and the SW line can be directly connected to the switch transistor. The pMOS transistor 26 restores the Vdd level on this line. The nMOS transistors 24 and 22 also isolate the peripheral circuitry from the high programming voltage in the memory element (during programming of the EEPROM cells 14, 16).

Figure 5:
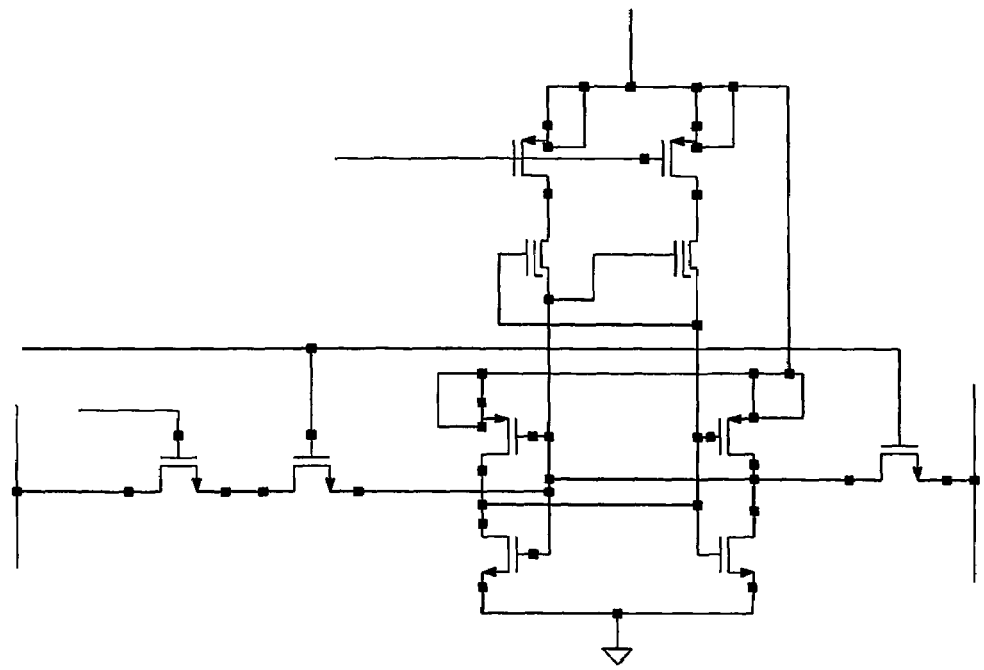
FIG. 5 is a schematic circuit diagram illustrating a non-volatile latch with an EEPROM element, according to a third exemplary embodiment of the present invention, and operating as a data memory in a field programmable gate array.
Figure 6:
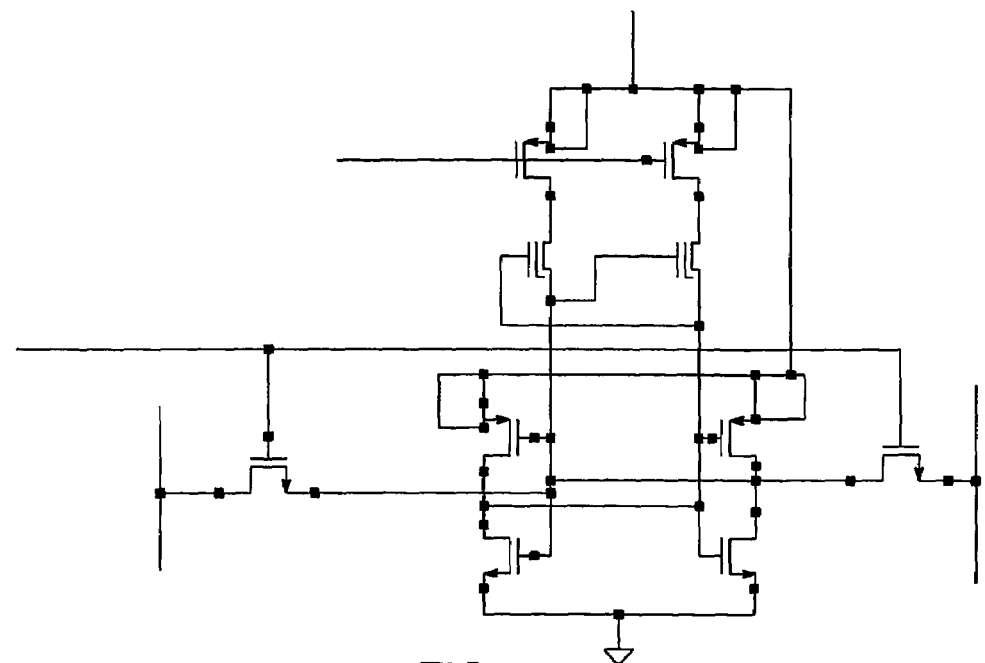
FIG. 6 is a schematic circuit diagram illustrating a non-volatile static memory according to a fourth exemplary embodiment of the present invention.

FIG. 5 shows a similar memory element which is adapted for an environment that allows operation as data memory in FPGA structures; and FIG. 6 shows an arrangement in which the static memory cell is a classic SRAM cell.

An embodiment of the present invention has been described above by way of example only, and it will be apparent to a person skilled in the art that modifications and variations can be made to the described embodiment without departing from the scope of the invention as defined by the appended claims. It will be understood that the term "comprising" does not exclude other elements or steps, "a" or "an" does not exclude a plurality, and a single processor or other unit may fulfill the functions of several means recited in the claims.

The invention claimed is:

1. A memory device comprising, in a single integrated circuit package:
    a static memory means defining at least first and second nodes communicatively connected with read and/or write data lines, wherein the static memory means comprises a pair of cross-coupled inverters, each of the cross-coupled inverters including first and second transistors that are connected in series, sources of the first transistors of the cross-coupled inverters being connected to each other; and
    at least one non-volatile memory means associated with said static memory means, and writing data stored therein to said static memory means; said non-volatile memory means comprising a first non-volatile element having a control gate connected to a first node and a source connected to a second node, and a second non-volatile element having a control gate connected to the second node and a source connected to the first node, the drain of each non-volatile element being connected by means of a respective transistor to a supply means; characterized in that said respective transistors are arranged to isolate the drains of the first and second non-volatile elements from the supply means during a program cycle of the memory device, the drains of the first and second non-volatile elements being connected to drains of the respective transistors, the supply means being connected to sources of the respective transistors, the sources of the respective transistors being also connected to the sources of the first transistors of the cross-coupled inverters.

2. A memory device according to claim 1, wherein said non-volatile memory elements comprise embedded flash or EEPROM elements.

3. A memory device according to claim 1, wherein said non-volatile memory elements comprise double or single poly floating gate type memory cells.

4. A memory device according to claim 1, wherein said non-volatile memory elements comprise devices which can be programmed and erased by means of tunneling of charges.

5. A memory device according to claim 1, wherein the non-volatile memory elements are programmed with opposite data.

6. A memory device according to claim 1, wherein one or more respective selection transistors are provided, by means of which the nodes are communicatively coupled to the read and/or write lines.

7. A memory device according to claim 1, including one or more isolation transistors.

8. A reconfigurable programmable logic device including a memory device according to claim 1.

9. A field programmable gate array including a memory device according to claim 1.

10. A memory device according to claim 1, wherein gates of the respective transistors are connected together to receive a common signal.

* * * * *